(12) United States Patent
Savandaiah et al.

(10) Patent No.: US 11,114,288 B2
(45) Date of Patent: Sep. 7, 2021

(54) PHYSICAL VAPOR DEPOSITION APPARATUS

(71) Applicant: APPLIED MATERIALS, INC., Santa Clara, CA (US)

(72) Inventors: Kirankumar Neelasandra Savandaiah, Bangalore (IN); Junqi Wei, Singapore (SG); Yueh Sheng Ow, Singapore (SG); Wen Long Favier Shoo, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 62 days.

(21) Appl. No.: 16/271,473

(22) Filed: Feb. 8, 2019

(65) Prior Publication Data
US 2020/0258723 A1    Aug. 13, 2020

(51) Int. Cl.
*H01J 37/34* (2006.01)
*C23C 14/35* (2006.01)
(Continued)

(52) U.S. Cl.
CPC .......... *H01J 37/3405* (2013.01); *C23C 14/14* (2013.01); *C23C 14/3407* (2013.01);
(Continued)

(58) Field of Classification Search
CPC ....... C23C 14/14; C23C 14/16; C23C 14/165; C23C 14/18; C23C 14/185; C23C 14/20;
(Continued)

(56) References Cited

U.S. PATENT DOCUMENTS 3,437,888 A    4/1969 Hall
5,863,399 A    1/1999 Sichmann
(Continued)

FOREIGN PATENT DOCUMENTS

EP    215 302 A1    6/2002
JP    H10204630 A    8/1998
(Continued)

OTHER PUBLICATIONS

Ayoub et al. "The surface morphology of thin Au films deposited on Si(001) substrates by sputter deposition", Thin Solid Films, 534 (2013) 54-61. (Year: 2013).*
(Continued)

*Primary Examiner* — Rodney G McDonald
(74) *Attorney, Agent, or Firm* — Moser Taboada

(57) ABSTRACT

Methods and apparatus for physical vapor deposition are provided. The apparatus, for example, includes A PVD apparatus that includes a chamber including a chamber wall; a magnetron including a plurality of magnets configured to produce a magnetic field within the chamber; a pedestal configured to support a substrate; and a target assembly comprising a target made of gold and supported on the chamber wall via a backing plate coupled to a back surface of the target so that a front surface of the target faces the substrate, wherein a distance between a back surface formed in a recess of the backing plate and a bottom surface of the plurality of magnets is about 3.95 mm to about 4.45 mm, and wherein a distance between the front surface of the target and a front surface of the substrate is about 60.25 mm to about 60.75 mm.

20 Claims, 6 Drawing Sheets

(51) Int. Cl.
*C23C 14/14* (2006.01)
*C23C 14/34* (2006.01)

(52) U.S. Cl.
CPC .......... *C23C 14/35* (2013.01); *H01J 37/3417* (2013.01); *H01J 37/3435* (2013.01); *H01J 37/3441* (2013.01)

(58) Field of Classification Search
CPC ...... C23C 14/205; C23C 14/35; H01J 37/345; H01J 37/3452; H01J 37/3455; H01J 37/3447; H01J 37/3441; H01J 37/3408; H01J 37/3405; H01J 37/3414
USPC ................................................ 204/298.11
See application file for complete search history.

(56) References Cited

U.S. PATENT DOCUMENTS

| | | | | |
|---|---|---|---|---|
| 5,914,018 | A * | 6/1999 | Fu | C23C 14/3407 |
| | | | | 204/298.12 |
| 6,096,180 | A | 8/2000 | Sichmann | |
| 6,149,784 | A * | 11/2000 | Su | C23C 14/3407 |
| | | | | 204/192.12 |
| 6,416,634 | B1 * | 7/2002 | Mostovoy | C23C 14/34 |
| | | | | 204/192.12 |
| 6,436,207 | B1 | 8/2002 | Abburi et al. | |
| 6,627,050 | B2 | 9/2003 | Miller et al. | |
| 6,641,701 | B1 * | 11/2003 | Tepman | H01J 37/3405 |
| | | | | 204/192.1 |
| 8,968,537 | B2 * | 3/2015 | Rasheed | C22C 19/03 |
| | | | | 204/298.12 |
| 9,127,356 | B2 | 9/2015 | Chueh et al. | |
| 2008/0271997 | A1 * | 11/2008 | Facey | C23C 14/3407 |
| | | | | 204/298.13 |
| 2011/0278165 | A1 * | 11/2011 | Rasheed | C23C 14/35 |
| | | | | 204/298.11 |

FOREIGN PATENT DOCUMENTS

| | | | |
|---|---|---|---|
| JP | 2007-247061 | * | 9/2007 |
| KR | 100730243 B1 | | 6/2007 |
| WO | WO-2010134691 A2 | | 11/2010 |

OTHER PUBLICATIONS

Machine Translation of JP 2007-247061 dated Sep. 2007. (Year: 2007).*
U.S. Appl. No. 16/271,473, filed Feb. 8, 2019.
International Search Report and Written Opinion for PCT/US2020/016332 dated Jun. 5, 2020.

* cited by examiner

PHYSICAL VAPOR DEPOSITION APPARATUS

FIELD

Embodiments of the present disclosure generally relate to substrate processing equipment and techniques, and more particularly, to methods and apparatus for depositing materials via physical vapor deposition.

BACKGROUND

The inventors have provided methods and apparatus for depositing materials via physical vapor deposition (PVD). More particularly, the inventors have provided PVD apparatus that use target material made of gold (Au). An advantage of using Au for the target material over other target materials, e.g., copper, tungsten, etc., can include, for example, target deposition uniformity, such as when used for redistribution layer, wire bond, and bump applications.

Various factors can contribute to Au target deposition uniformity. For example, erosion profiles of the Au target during PVD, Au target crystallographic texture, substrate to Au target distance, a gas scattering factor during PVD, power (kilowatt-hours) used for performing PVD, a thickness (e.g., typically measured in microns, or number of 1 micron depositions) of the Au target, a geometry of the Au target, magnet design of the PVD apparatus, magnet distance to Au target, etc.

The inventors have found that in addition to being an important factor in determining deposition uniformity, the erosion profile of the Au target can also contribute to a lifetime of the Au target.

Accordingly, since a cost of using Au as target material can be quite high when compared to using other target materials, the inventors have provided improved methods and apparatus for using Au as a target material during PVD.

SUMMARY

Methods and apparatus for performing PVD are provided herein. In some embodiments, an apparatus includes a chamber including a chamber wall; a magnetron including a plurality of magnets configured to produce a magnetic field within the chamber; a pedestal configured to support a substrate; and a target assembly comprising a target made of gold and supported on the chamber wall via a backing plate coupled to a back surface of the target so that a front surface of the target faces the substrate, wherein a distance between a back surface of the backing plate and a bottom surface of the plurality of magnets is about 3.95 mm to about 4.45 mm, and wherein a distance between the front surface of the target and a front surface of the substrate is about 60.25 mm to about 60.75 mm.

In accordance with an embodiment of the disclosure, there is provided a target assembly for use with a physical vapor deposition (PVD) apparatus. The target assembly can include a target made of gold and configured to be supported on a chamber wall via a backing plate coupled to a back surface of the target so that a front surface of the target faces a substrate when the target assembly is coupled to the PVD apparatus, wherein the target has a first diameter that is measured from an upper corner of a peripheral sidewall of the target and is about 448.64 mm and a second diameter that is measured from a lower corner of the peripheral sidewall and is about 443.73 mm.

In accordance with an embodiment of the disclosure, there is provided a method for performing physical vapor deposition on a substrate using a physical vapor deposition (PVD) apparatus. The method can include supporting a target, which is made of gold, on a chamber wall of a chamber of the PVD apparatus via a backing plate coupled to a back surface of the target so that a front surface of the target faces the substrate; maintaining a distance between a back surface of the backing plate and a bottom surface of a plurality of magnets of the PVD apparatus at about 3.95 mm to about 4.45 mm; maintaining a distance between the front surface of the target and a front surface of the substrate at about 60.25 mm to about 60.75 mm; and performing PVD on the substrate Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1A:
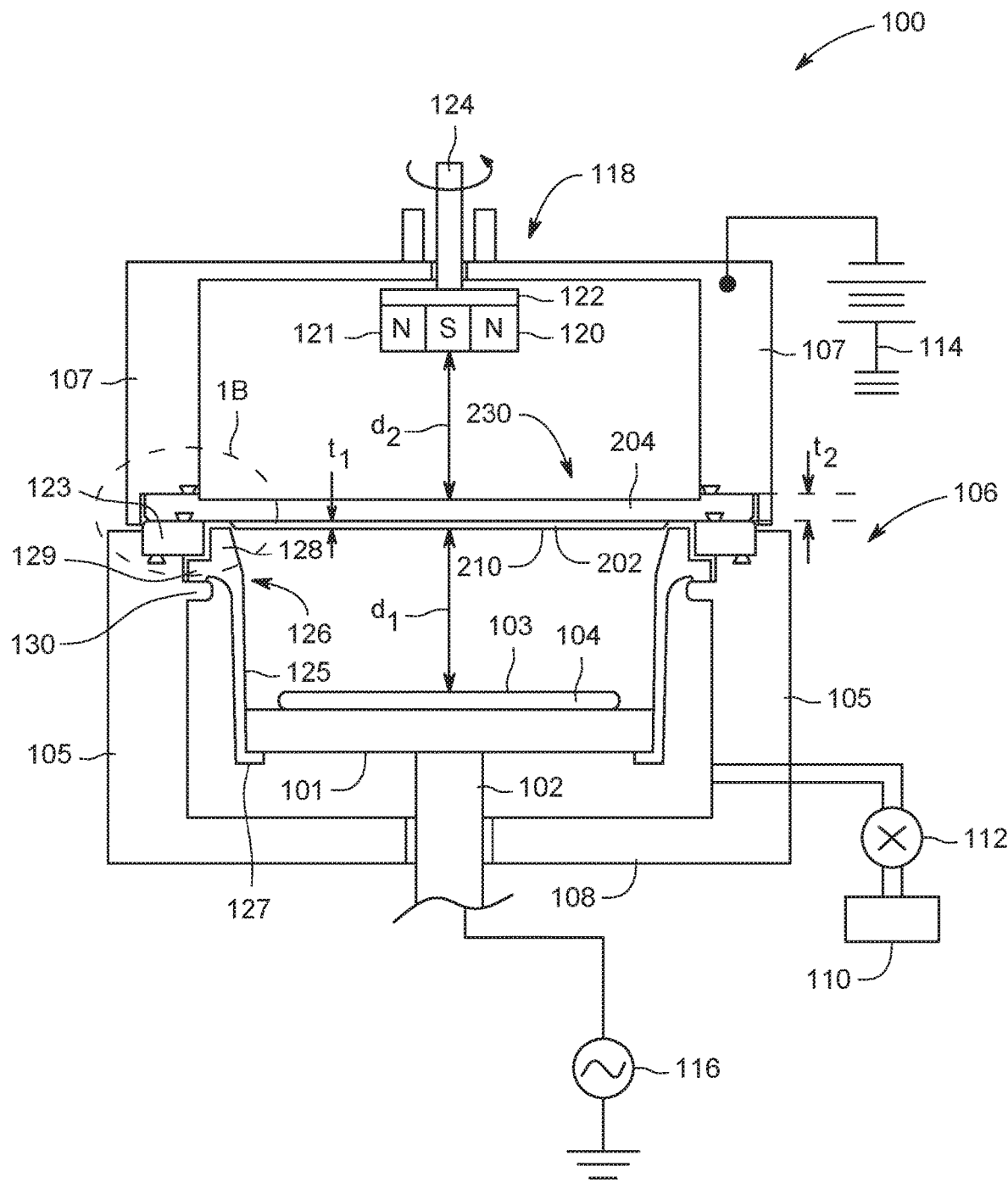
FIG. 1A is a diagram of a PVD apparatus according to at least some embodiments of the disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for performing PVD are described herein. More particularly, methods and apparatus described herein include an Au target coupled to a backing plate, and erosion profiles of the Au target and the backing plate are considered for improving deposition uniformity and lifetime of the Au target. In addition, when compared to conventional PVD apparatus that use Au targets, the methods and apparatus for performing PVD described herein: are relatively inexpensive, are relatively lightweight (as a result of the relatively high-strength backing plate coupled (bonded) to the Au target), provide higher throughput (as a result of the relatively high power, robust configuration of the Au target and backing plate, and the ability of the Au target and backing plate to operate at relatively cool temperatures without debonding), and use fewer particles (as a result of the assembly design of the Au target, target defection is reduced), which, in turn, increases the lifetime of the Au target, which in turn increases the amount PVD processes can be performed without having to change the Au target.

Figure 1B:
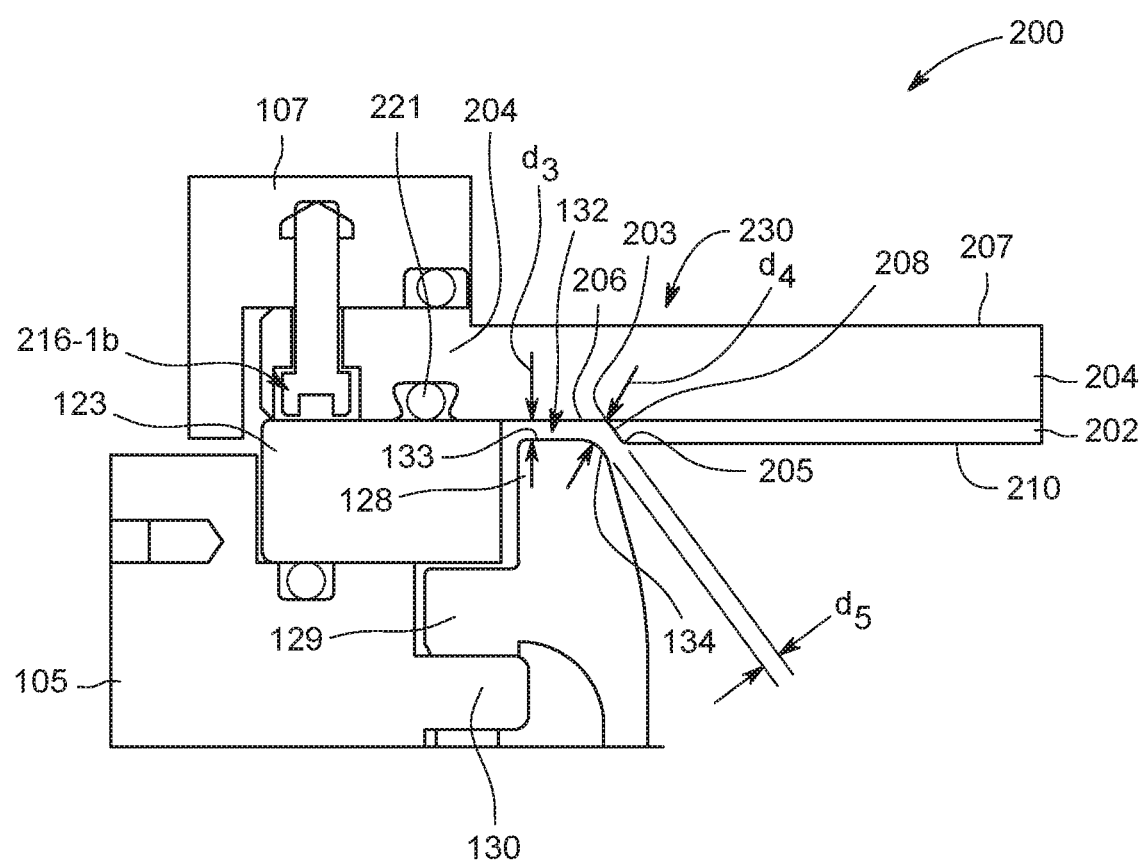
FIG. 1B is the enlarged indicated area of detail 1B of FIG. 1A according to at least some embodiments of the disclosure.

FIG. 1A is a diagram of a PVD apparatus 100 and FIG. 1B is the enlarged indicated area of detail 1B of FIG. 1A according to at least some embodiments of the disclosure. Relative terms, such as top, bottom, front, or back are used herein for clarity and consistency with the views shown in the drawings and are not meant to be limiting of the scope of the disclosure, which for example, can be implemented in configurations other than as depicted herein.

An example of a suitable PVD apparatus is the CHARGER under bump metallization (UBM) PVD apparatus and the Endura® 2 PVD apparatus, both commercially available from Applied Materials, Inc.

Generally, the PVD apparatus 100 contains a sputtering source, such as target assembly 200 (FIG. 1B) including a target 202 (e.g., source material) and a backing plate 204, which will be described in greater detail below, and a substrate support pedestal (pedestal 102) for receiving a substrate 104 (e.g., a semiconductor substrate) thereon and located within a grounded side chamber wall 105 (e.g., made of aluminum) of a chamber 106.

The pedestal 102 supports the substrate 104 to be sputter coated in planar opposition to a principal face (bottom or front surface 210) of the target 202. The pedestal 102 has a planar substrate-receiving surface disposed opposite and generally parallel to the sputtering surface of the target 202. The pedestal 102 is vertically movable through a bellows (not shown) connected to a bottom chamber wall 108 to allow the substrate 104 to be transferred onto the pedestal 102 through a slit valve (not shown) in the lower portion of the chamber 106 and subsequently raised to a deposition position. More particularly, the deposition position is measured from the front surface 210 of the target 202 to a top surface 103 (e.g., the working surface of the substrate where material is to be sputter deposited) of the substrate 104 and is equal to a distance d1 of about 60.25 mm (2.37 inches) to about 60.75 mm (2.39 inches). The inventors have found that positioning the top surface 103 of the substrate 104 relative to the front surface 210 of the target 202 within the ranges of the distance d1 provides improved sputter coverage to the top surface 103 of the substrate 104 and can increase the lifetime of the target 202.

A rotatable magnetron 118 coupled to a grounded conductive cathode assembly 107, which is coupled to the side chamber wall 105, is positioned in back of the backing plate 204 and the target 202 and can include a plurality of magnets 120 (e.g., magnets shown schematically) supported by a base plate 122 connected to a rotation shaft 124 coincident with the central axis of the chamber 106 and the substrate 104. The magnets 120 can be arranged in closed pattern, for example having a kidney shape. The magnets 120 produce a magnetic field within the chamber 106, generally parallel and close to the front face of the target 202 to trap electrons and increase a local plasma density, which in turn can increase a sputtering rate. The magnets 120 produce an electromagnetic field around the top of the chamber 106, and the magnets 120 can be rotated to rotate the electromagnetic field which influences the plasma density of the process to more uniformly sputter the target 202. A distance d2 that is measured from a bottom surface 121 of the plurality of magnets 120 to a back (or top) surface 207 within a recess 230 of the backing plate 204 is about 3.95 mm (0.155 inches) to about 4.45 mm (0.175 inches). The inventors have found that positioning the bottom surface 121 of the plurality of magnets 120 relative to the back surface 207 of the backing plate 204 within the ranges of the distance d2 provides improved plasma density (and/or sputtering rate) and increases the lifetime of the target 202.

The chamber 106 may also be adapted to provide a more directional sputtering of material onto the substrate 104. For example, directional sputtering may be achieved by positioning a collimator (not shown) between the target 202 and the pedestal 102 to provide a more uniform and symmetrical flux of deposition material on the substrate 104.

The pedestal 102 can include a heating portion (not shown) including heating elements, fluid channels (not shown) which may be coupled to the heating portion and configured to provide for either heating or cooling of the pedestal 102, and temperature sensors (not shown), such as a thermocouple, that may be attached to or embedded in the pedestal 102 to monitor temperature in a conventional manner.

Processing gas can be supplied from a gas source 110 through a mass flow controller 112 into the lower part of the chamber 106 adjacent the pedestal 102. An RF power supply 116 may be connected to the pedestal 102 to induce a negative DC self-bias on the substrate 104—but in other applications the pedestal 102 can be grounded or left electrically floating—and a controllable DC power source 114 coupled to the chamber 106 may be used to apply a negative voltage or bias to the target 202.

Continuing with reference to FIG. 1A, the chamber 106 includes a grounded shield 126 having an upper portion 128 including a flange 129 supported on and electrically connected to a ledge 130 of the side chamber wall 105. The shield 126 also includes an elongated portion 125 that extends downwardly from the upper portion 128 along the side chamber wall 105 and a bottom portion 127 that is coupled to a bottom surface 101 of the pedestal 102 via one or more suitable coupling devices (e.g., screws, bolts, clips, etc.). The shield 126 can be formed, for example, from hard, non-magnetic stainless steel.

With reference to FIG. 1B, the upper portion 128 of the shield 126 closely fits in an annular recess 132 formed between a front surface 206 of the backing plate 204 and an angled peripheral sidewall 208 of the target 202. A distance d3 that a top surface 133 of the upper portion 128 is from the front surface 206 of the backing plate 204 is about 2.92 mm (0.115 inches) to about 3.17 mm (0.125 inches). Moreover, a distance d4 from an inside corner 134 of the upper portion 128 of the shield 126 to an upper corner 203 (adjacent the front surface 206 of the backing plate 204) of the peripheral sidewall 208 is about 2.73 mm (0.107 inches) to about 3.23 mm (0.127 inches). Furthermore, a distance d5 from the inside corner 134 of the upper portion 128 to a lower corner 205 of the peripheral sidewall 208 is about 1.52 mm (0.06 inches) to about 1.77 mm (0.07 inches), wherein a distance that the inside corner 134 of the upper portion of the shield 128 is from the peripheral sidewall 208 of the target 202 is about 1.84 mm to about 2.34 mm. The distances d3-d5 define a narrow gap between the inside corner 134 of the upper portion 128 and the peripheral sidewall 208 of the target 202. The gap is sufficiently narrow to prevent plasma from penetrating between the inside corner 134 and the peripheral sidewall 208, hence protecting other components within the chamber 106 (e.g., a dielectric isolator 123 (FIGS.

1A and 1B) from being sputter coated with a metal layer (e.g., with an Au layer), which could possibly electrically short the target 202.

Figure 2:
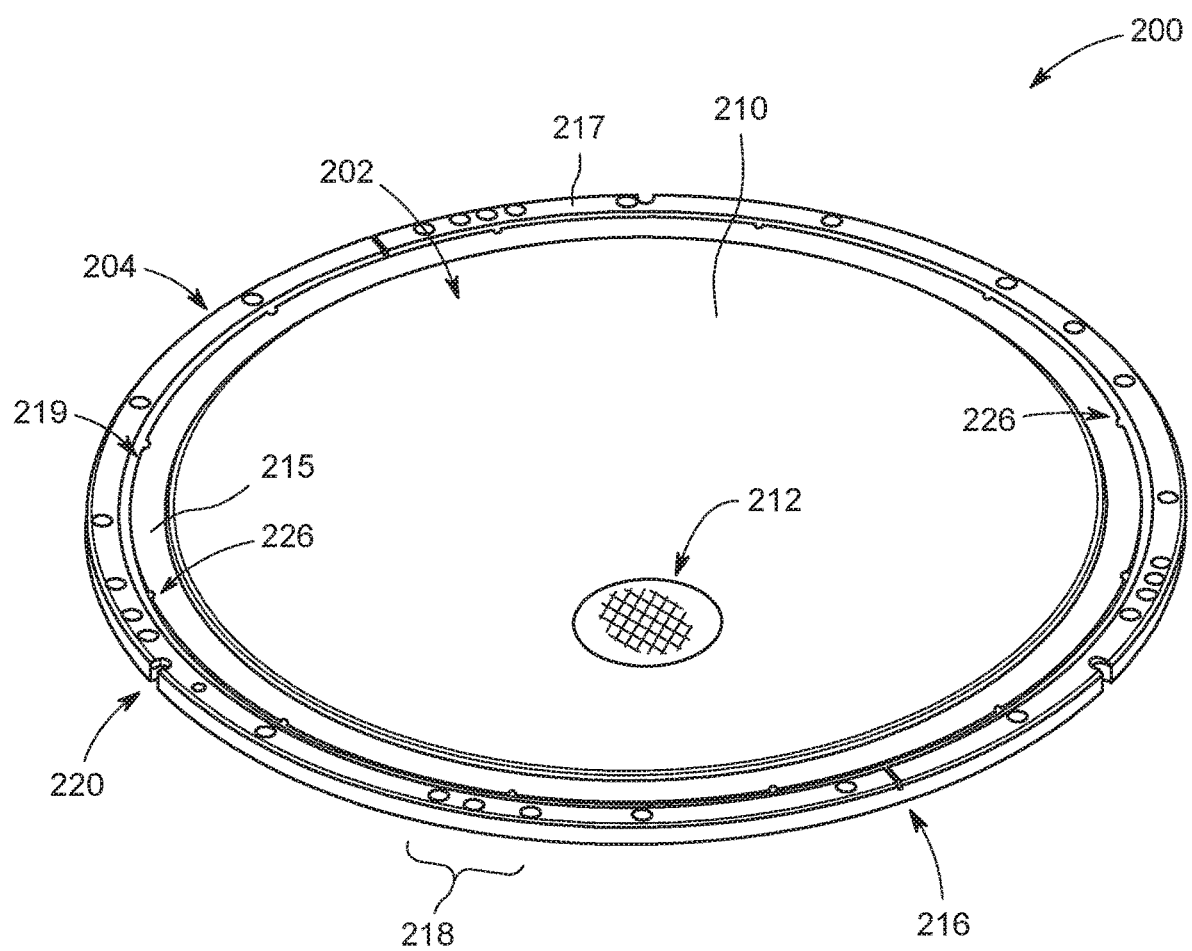
FIG. 2 is an isometric view of an apparatus including a target coupled to a backing plate used with the PVD of FIG. 1A according to at least some embodiments of the disclosure.

FIG. 2 is an isometric view of the target assembly 200 including the target 202 coupled to the backing plate 204 used with the PVD apparatus 100 of FIG. 1A according to at least some embodiments of the disclosure. The target 202 is made from Au having a minimum purity of 99.99% and is deposited on the substrate 104 surface during sputtering. The target 202 has a generally circular configuration, but can have other geometric configurations, e.g., oval, oblong, square, rectangular, etc. The front surface 210 of the target 202 is generally planar and can be texturized 212 (a portion of the texturized 212 surface is shown with hatching for illustrative purposes) with a surface roughness ranging from about 27 microinches to about 37 microinches, but the present disclosure is not so limited and the front surface 210 can be provided with other texturing or without being texturized 212.

Figure 4A:
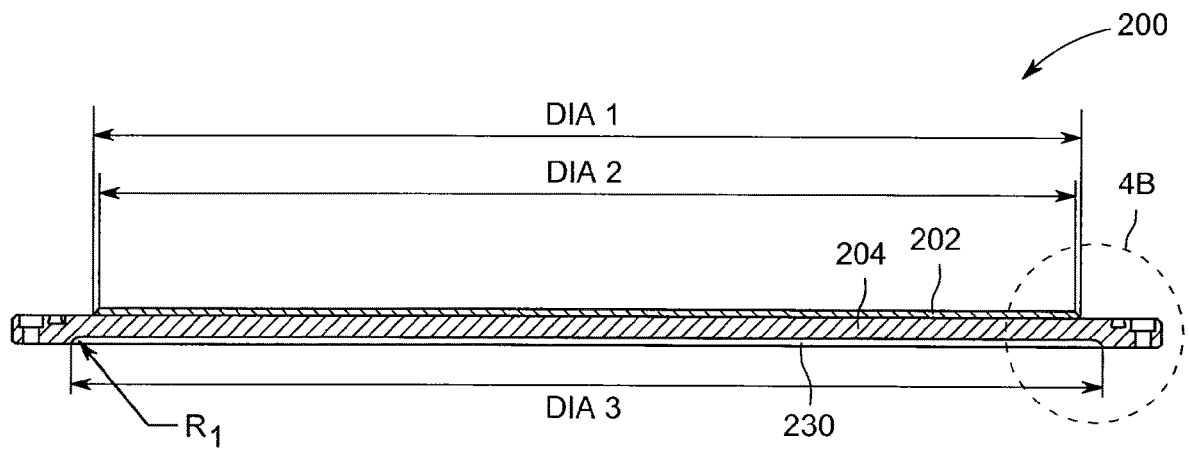
FIG. 4A is a cross-sectional view taken along line 4A-4A of FIG. 3 according to at least some embodiments of the disclosure.
Figure 4B:
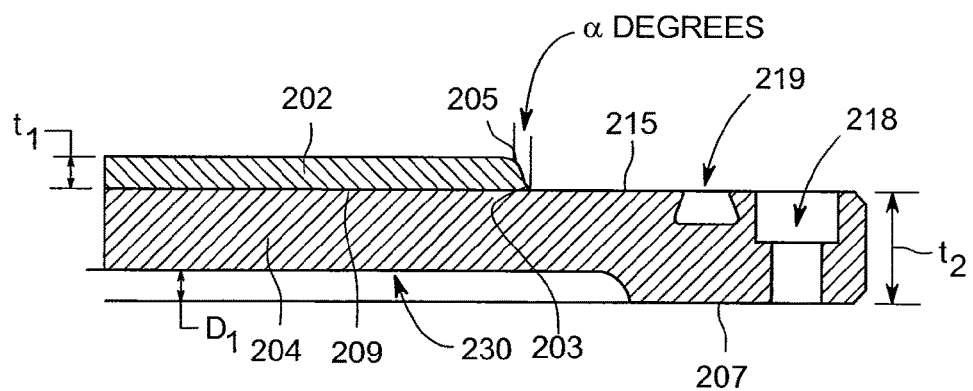
FIG. 4B is the enlarged indicated area of detail 4B of FIG. 4A according to at least some embodiments of the disclosure.

The target 202 can have a thickness t1 of about 2.925 mm (0.115 inches) to about 3.425 mm (0.134 inches), see FIG. 1A and FIG. 4B, for example. In some embodiments, the target 202 can have a thickness (not shown) of about 12.45 mm (0.490 inches) to about 12.95 mm (0.509 inches).

The target 202 is coupled to the backing plate 204 using one or more suitable coupling methods. For example, in some embodiments, a metallic surface layer 209 (see FIG. 4B), e.g., indium solder bond, can be used to bond the target 202 to the backing plate 204.

The backing plate 204 includes a generally circular configuration, not unlike the target 202, and is made from at least one of copper, nitrogen, zinc, chromium, or silicon. The backing plate 204, at a thickest point, has a thickness t2 of about 12.45 mm (0.490 inches) to about 12.95 mm (0.509 inches), see FIG. 1A and FIG. 4B, for example.

The backing plate 204 includes an inner portion 215 for bonding the target 202 to the backing plate 204 and an outer portion 217. The outer portion 217 can include a plurality of features disposed therealong, such as apertures 218, notches 220 (e.g., three), slits 216 (e.g., two), or the like. The apertures 218, for example, are configured to receive one or more types of fasteners, e.g., screws, bolts, etc., for mounting the backing plate 204 including the target 202 to the cathode assembly 107 (see FIG. 1B, for example). The notches 220 are configured to help align the apertures 218 of the backing plate 204 with corresponding apertures on the cathode assembly 107 when mounting the backing plate 204 to the cathode assembly 107. An annular O-ring groove 219 of suitable configuration is provided between and separates the inner portion 215 and the outer portion 217 and is configured to receive an O-ring 221 (see FIG. 1B, for example) that is used to provide a seal between the backing plate 204 and the dielectric isolator 123. A more detailed description of the O-ring groove 219 is also described below. The slits 216 are configured to provide an exit path for gases from the O-ring groove 219 when the target assembly 200 is installed.

Figure 3:
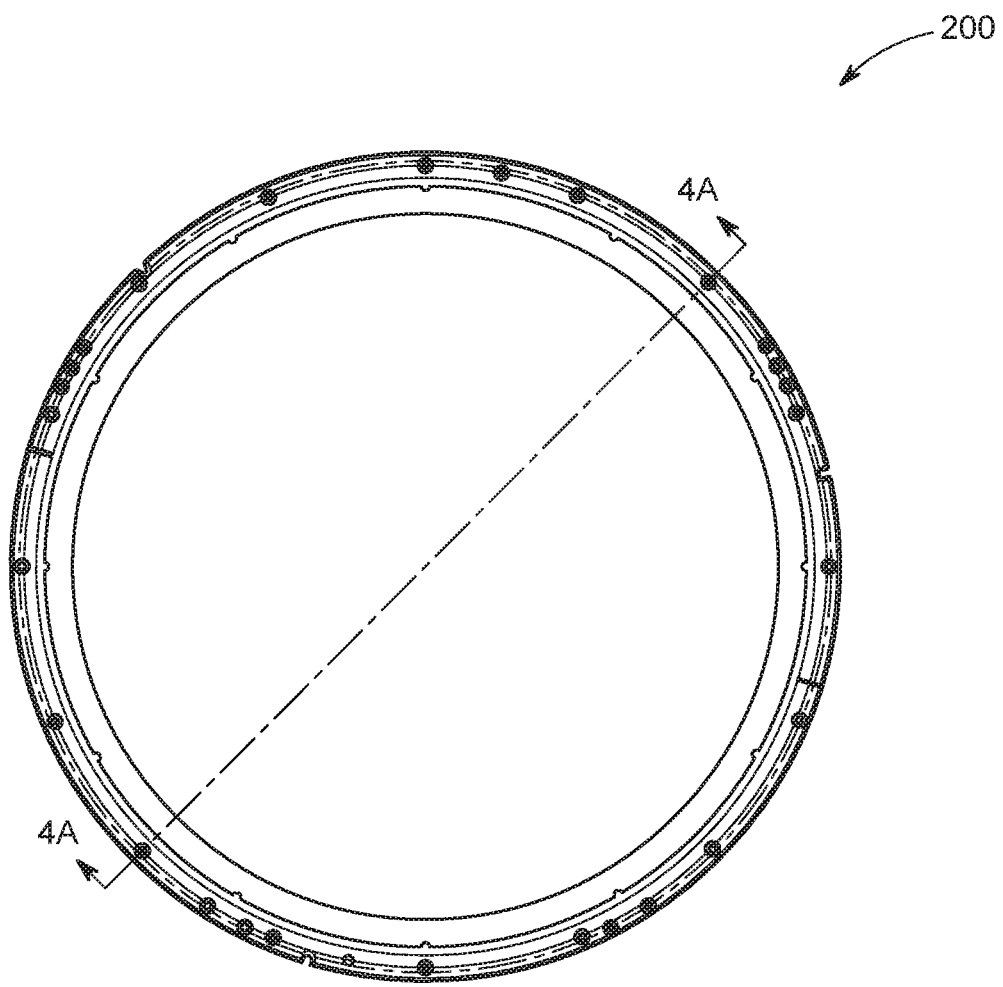
FIG. 3 is top plan view of the target and backing plate according to at least some embodiments of the disclosure.

FIG. 3 is top plan view of the target assembly 200 including the target 202 and backing plate 204 and FIG. 4A is a cross-sectional view taken along line 4A-4A of FIG. 3 according to at least some embodiments of the disclosure. For illustrative purposes, the target assembly 200 is shown inverted with respect to FIGS. 2 and 3. As shown in FIG. 4A, the target 202 has a first diameter DIA1 that is measured from the upper corner 203 of the peripheral sidewall 208 and is approximately equal to about 448.38 mm (17.65 inches) to about 448.89 mm (17.67 inches) and a second diameter DIA2 that is measured from the lower corner 205 that is approximately equal to about 443.48 mm (17.45 inches) to about 443.98 mm (17.47 inches). The recess 230 can be provided along the back of the backing plate 204, and as noted above, the distance d2 is measured from the back surface 207 within the recess 230 to the bottom surface 121 of the plurality of magnets 120. The recess 230 can have a diameter DIA3 approximately equal to 469.65 mm (18.49 inches) to about 470.15 mm (18.50 inches). The periphery of the recess 230 has a radius of curvature R1 coupling a substantially planar inner surface of the recess 230 (e.g., the back surface 207 of the backing plate within the recess 230) with a substantially planar peripheral surface of the backing plate. The front surface 210 of the target 202 can be texturized 212 with a surface roughness of about 27 microinches to about 37 microinches.

FIG. 4B is the enlarged indicated area of detail 4B of FIG. 4A according to at least some embodiments of the disclosure. The recess 230 of the back surface 207 can have a depth D1 approximately equal to about 2.92 mm (0.114 inches) to about 3.42 mm (0.134 inches). Additionally, the lower corner 205 and the upper corner 203 have a generally curved configuration. The peripheral sidewall 208 of the target 202 is angled and generally linear between the lower corner 205 and the upper corner 203 and is disposed at an angle α of about 14 to about 16 degrees, such as at about 15 degrees.

Figure 5:
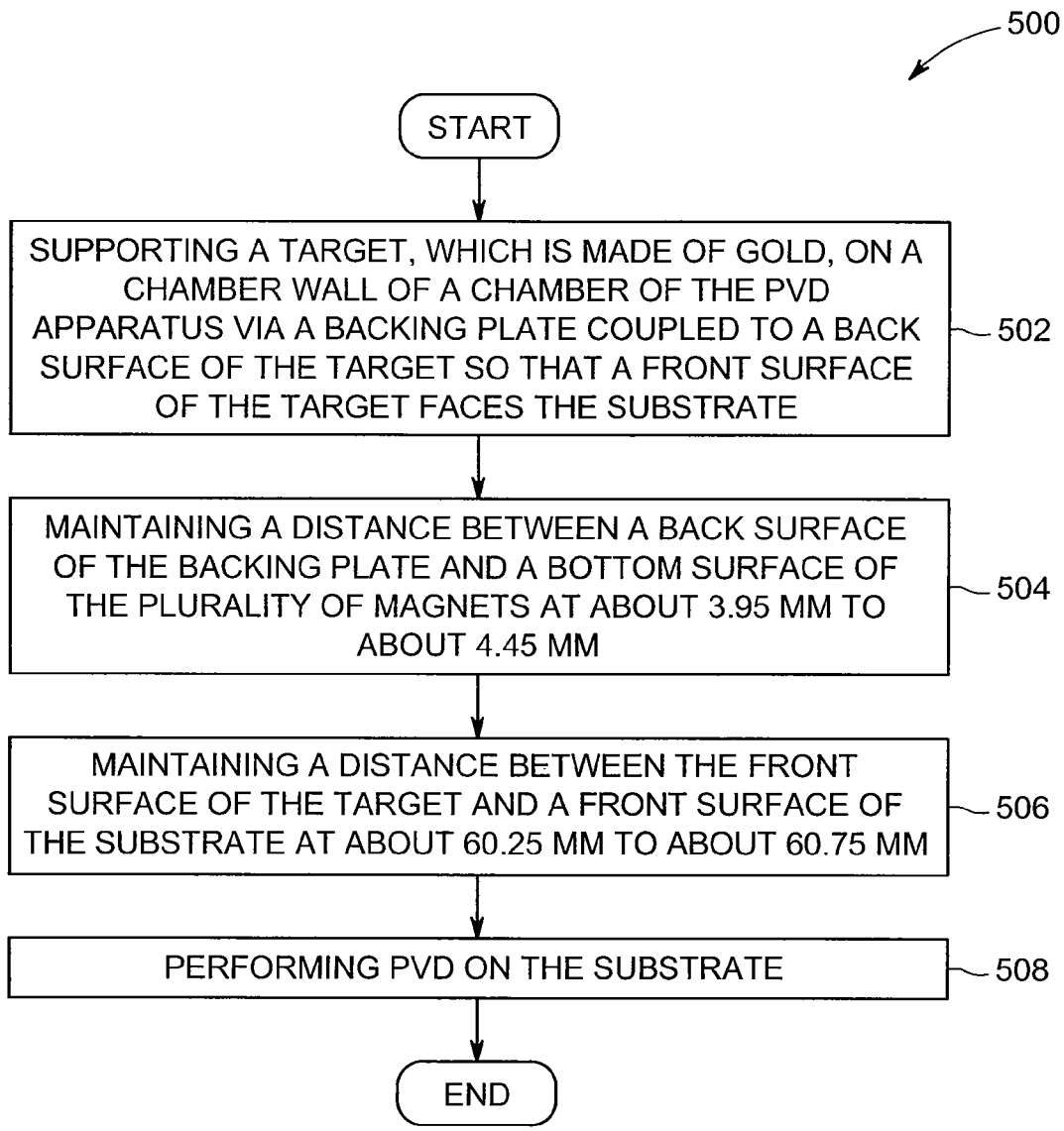
FIG. 5 is a flowchart of a method for performing PVD using the PVD apparatus of FIG. 1A according to at least some embodiments of the disclosure.

FIG. 5 is a flowchart of a method 500 for performing PVD using the PVD apparatus of FIG. 1A according to at least some embodiments of the disclosure. At 502, the target 202, which is made of gold, is supported on the side chamber wall 105 of the chamber 106 of the PVD apparatus 100 via the backing plate 204 operably coupled to the back surface (not shown) of the target 202. The back surface 207 of the backing plate 204 faces the magnetron 118 including a plurality of magnets 120 of the PVD apparatus, and the front surface 210 of the target 202 faces the substrate 104 to which PVD is to be performed in the chamber 106 of the PVD apparatus 100.

At 504, the back surface 207 of the backing plate to the bottom surface 121 of the plurality of magnets 120 is maintained at a distance d2 ranging from about 3.95 mm to about 4.45 mm. At 506, the front surface 210 of the target 202 to the top surface 103 of the substrate 104 is maintained at a distance d1 ranging from about 60.25 mm to about 60.75 mm.

Thereafter, at 508 PVD is performed on the substrate 104. For example, during the PVD process the power for sputtering the target 202 can be about 2.5 kW (+/−0.5 kW) and the pressure can be about 2 mTorr (+/−0.5 mTorr), which provides an achievable deposition rate of about 55 A/s.

The inventors have discovered that a target and process chamber as disclosed herein can have an unexpected and dramatic increase in usable lifetime. For example, a target installed in a process chamber having the target to substrate spacing (e.g., d1) and target to magnet spacing (e.g., d2) can have a target life of about 180 kWh, as compared to conventional target life of less than 100 kWh. Moreover, materials can be deposited on the substrate in a very uniform manner, for example, as measured by a sheet resistance (Rs) variation of less than 1%.

While the foregoing is directed to embodiments of the present disclosure, other and further embodiments of the disclosure may be devised without departing from the basic scope thereof.

The invention claimed is:

1. A PVD apparatus, comprising:
a chamber including a chamber wall;
a magnetron including a plurality of magnets configured to produce a magnetic field within the chamber;
a pedestal configured to support a substrate;
a shield; and
a target assembly comprising a target made of gold and supported on the chamber wall via a backing plate coupled to a back surface of the target so that a front surface of the target faces the substrate,
wherein a distance from an inside corner of an upper portion of the shield to an upper corner, which meets a front surface of the backing plate, of a peripheral sidewall of the target is about 2.73 mm to about 3.23 mm,
wherein a distance between a back surface of the backing plate and a bottom surface of the plurality of magnets is about 3.95 mm to about 4.45 mm, and
wherein a distance between the front surface of the target and a front surface of the substrate is about 60.25 mm to about 60.75 mm.

2. The PVD apparatus of claim 1, wherein the backing plate is made from at least one of zinc, chromium, or silicon.

3. The PVD apparatus of claim 2, wherein the backing plate is coupled to the target via an indium solder bond.

4. The PVD apparatus of claim 1, wherein the front surface of the target is texturized with a surface roughness ranging from about 27 microinches to about 37 microinches.

5. The PVD apparatus of claim 1, wherein the upper portion of the shield fits in an annular recess formed between a front surface of the backing plate and the peripheral sidewall of the target.

6. The PVD apparatus of claim 5, wherein a distance that the inside corner of the upper portion of the shield is from the peripheral sidewall of the target is about 1.84 mm to about 2.34 mm.

7. The PVD apparatus of claim 5, wherein a distance that a top surface of the upper portion of the shield is from the front surface of the backing plate is about 2.92 mm to about 3.17 mm.

8. The PVD apparatus of claim 5, wherein the peripheral sidewall is angled from a lower corner to an upper corner, which extends to the front surface of the backing plate, of the peripheral sidewall, and wherein the angle is about 14 degrees to about 16 degrees.

9. The PVD apparatus of claim 8, wherein the target has a first diameter that is measured from the upper corner of the peripheral sidewall and is about 448.64 mm and a second diameter that is measured from the lower corner and is about 443.73 mm.

10. The PVD apparatus of claim 1, wherein the backing plate has a thickness of about 12.45 mm to about 12.95 mm.

11. The PVD apparatus of claim 1, wherein the target has one of:
a thickness of about 2.925 mm to about 3.425 mm; or
a thickness of about 12.45 mm to about 12.95 mm.

12. The PVD apparatus of claim 1, wherein a recess formed in the back surface of the backing plate has a depth of about 2.92 mm to about 3.42 mm.

13. The PVD apparatus of claim 12, wherein the recess formed in the back surface of the backing plate has a diameter of about 469.65 mm to about 470.15 mm.

14. A target assembly for use with a physical vapor deposition (PVD) apparatus, comprising:
a target made of gold and configured to be supported on a chamber wall via a backing plate coupled to a back surface of the target so that a front surface of the target faces a substrate when the target assembly is coupled to the PVD apparatus,
wherein the target has a first diameter that is measured from an upper corner, which extends to a front surface of the backing plate, of a peripheral sidewall of the target and is about 448.64 mm and a second diameter that is measured from a lower corner of the peripheral sidewall and is about 443.73 mm, and
wherein, when the target assembly is installed in PVD apparatus, a distance from the upper corner, which meets the front surface of the backing plate, of the peripheral sidewall of the target to an inside corner of an upper portion of a shield of the PVD apparatus is about 2.73 mm to about 3.23 mm.

15. The target assembly of claim 14, wherein the backing plate is made from at least one of copper, zinc, chromium, or silicon, and
wherein the backing plate is coupled to the target via an indium solder bond.

16. The target assembly of claim 14, wherein the backing plate has a thickness of about 12.45 mm to about 12.95 mm.

17. The target assembly of claim 14, wherein the target has one of:
a thickness of about 2.925 mm to about 3.425 mm; or
a thickness of about 12.45 mm to about 12.95 mm.

18. The target assembly of claim 14, wherein a recess formed in a back surface of the backing plate has a depth of about 2.92 mm to about 3.42 mm, and
wherein the recess has a diameter of about 469.65 mm to about 470.15 mm.

19. The target assembly of claim 14, wherein the front surface of the target is texturized with a surface roughness ranging from about 27 microinches to about 37 microinches.

20. A method for performing physical vapor deposition on a substrate using a physical vapor deposition (PVD) apparatus, comprising:
supporting a target, which is made of gold, on a chamber wall of a chamber of the PVD apparatus via a backing plate coupled to a back surface of the target so that a front surface of the target faces the substrate;
maintaining a distance between a back surface of the backing plate and a bottom surface of a plurality of magnets of the PVD apparatus at about 3.95 mm to about 4.45 mm;
maintaining a distance between the front surface of the target and a front surface of the substrate at about 60.25 mm to about 60.75 mm;
maintaining a distance between an inside corner of an upper portion of a shield and an upper corner, which meets a front surface of the backing plate, of a peripheral sidewall of the target at about 2.73 mm to about 3.23 mm; and
a target assembly comprising a target made of gold and supported on the chamber wall via a backing plate coupled to a back surface of the target so that a front surface of the target faces the substrate; and
performing PVD on the substrate.

* * * * *